United States Patent [19]

Matsushita et al.

[11] Patent Number: 5,437,734
[45] Date of Patent: Aug. 1, 1995

[54] SOLAR CELL

[75] Inventors: Takeshi Matsushita; Dharam P. Gosain; Jonathan Westwater; Setsuo Usui, all of Kanagawa; Kunio Hane, Tokyo, all of Japan

[73] Assignee: Sony Corporation, Tokyo, Japan

[21] Appl. No.: 193,467

[22] Filed: Feb. 8, 1994

[30] Foreign Application Priority Data

Feb. 8, 1993 [JP] Japan .................................. 5-041764

[51] Int. Cl.$^6$ .................... H01L 31/06; H01L 31/078
[52] U.S. Cl. ...................................... 136/249; 136/255; 136/261; 136/262
[58] Field of Search ................... 136/255, 249 TJ, 262, 136/261

[56] References Cited

U.S. PATENT DOCUMENTS 3,990,101  11/1976  Ettenberg et al. ................... 136/255
4,582,952  4/1986   McNeely et al. .............. 136/249 TJ Primary Examiner—Aaron Weisstuch
Attorney, Agent, or Firm—Hill, Steadman & Simpson

[57] ABSTRACT

Disclosed herein is a solar cell which is composed basically of a first semiconductor layer of first conductivity type, a second semiconductor layer of second conductivity type, and a third semiconductor layer formed between them. The third semiconductor layer has a band gap narrower than that of the first and second semiconductor layers. The third semiconductor layer also has a pn junction therein. The semiconductor layers are each separated by a buffer layer in which the composition changes gradually across the thickness so that the lattice mismatch between the semiconductor layers is relieved.

11 Claims, 3 Drawing Sheets

SOLAR CELL

BACKGROUND OF THE INVENTION

1. Field of the Invention

The present invention relates to a low-cost solar cell with high conversion efficiency.

2. Description of the Prior Art

Present-day solar cells are made from a variety of Group IV materials (such as single-crystal silicon, polycrystal silicon, amorphous silicon, amorphous SiC, amorphous SiGe, and amorphous SiSn), Group III-V materials (such as GaAs, AlGaAs, and InP), and Group II-VI materials (such as CdS, CdTe, and $CU_2S$). They also come in varied structures, such as pn structure (including that of back surface field), pin structure, heterojunction structure, Schottky structure, tandem type, and multijunction structure (including that of vertical junction).

Solar cells are required to have a high conversion efficiency, to be produced at a low cost, and to recover their production cost in a short period. These requirements have not been met so far. A solar cell of single-crystal silicon or polycrystal silicon has a high conversion efficiency but takes a long time (more than 10 years) to recover its production cost. A solar cell of amorphous silicon is produced at a low cost (and hence recovers its production cost in a short period) but is poor in conversion efficiency. A solar cell of GaAs has a high conversion efficiency but is more expensive than that of single-crystal silicon, and hence its use is limited. At present, there are no solar cells that meet the contradicting requirements: high conversion efficiency and low production cost.

SUMMARY OF THE INVENTION

It is an object of the present invention to provide a low-cost solar cell with high conversion efficiency.

The first aspect of the present invention resides in a solar cell which comprises (a) a first semiconductor layer of first conductivity type and having a first electrode thereon, (b) a second semiconductor layer of second conductivity type (opposite to the first conductivity type) which is on said first semiconductor layer and has a second electrode thereon, (c) a third semiconductor layer having a pn junction therein and positioned between said first and second semiconductor layers, and which has a band gap narrower than that of said first and second semiconductor layers, (d) a first buffer layer between said first and third semiconductor layers, which relieves the lattice mismatch between said first and third semiconductor layers, and (e) a second buffer layer between said second and third semiconductor layers, which relieves the lattice mismatch between said second and third semiconductor layers.

The second aspect of the present invention resides in a solar cell which comprises (a) a first semiconductor layer comprising a first semiconductor region of first conductivity type and having a first electrode thereon and a second semiconductor region of second conductivity type (opposite to the first conductivity type) and having a second electrode thereon, (b) a second semiconductor layer beneath said first semiconductor layer, which has a band gap narrower than that of said first semiconductor layer, and (c) a buffer layer between said first and second semiconductor layers, which relieves the lattice mismatch between said first and second semiconductor layers.

The third aspect of the present invention resides in a solar cell of tandem type in which the first, lower solar cell unit comprises (a) a first semiconductor layer of first conductivity type and having a first electrode thereon, (b) a second semiconductor layer of second conductivity type (opposite to the first conductivity type) which is on said first semiconductor layer, (c) a third semiconductor layer having a pn junction therein and positioned between said first and second semiconductor layers, which has a band gap narrower than that of said first and second semiconductor layers, (d) a first buffer layer between said first and third semiconductor layers, which relieves the lattice mismatch between said first and third semiconductor layers, and (e) a second buffer layer between said second and third semiconductor layers, which relieves the lattice mismatch between said second and third semiconductor layers, and the second, upper solar cell unit comprises (f) a fourth semiconductor layer of the first conductivity type, which is on said second semiconductor layer, and (g) a fifth semiconductor layer of the second conductivity type, which is on said fourth semiconductor layer and forms a pn junction therewith.

DETAILED DESCRIPTION OF THE INVENTION

Figure 1:
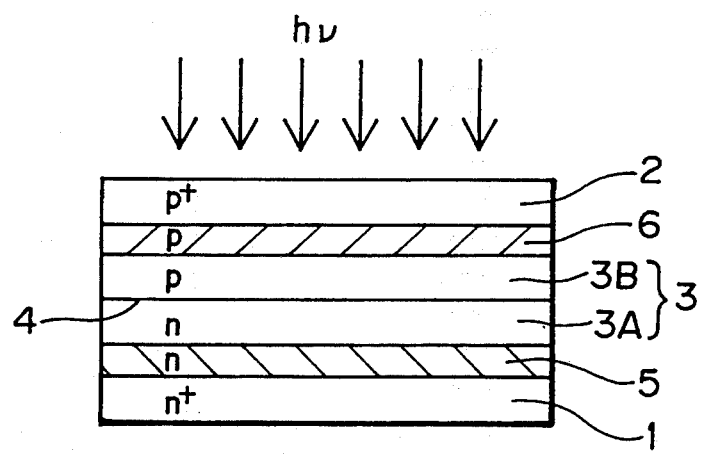
FIG. 1 is a schematic partial sectional view showing the basic structure of a solar cell according to the present invention.

The solar cell according to the present invention has a basic structure as shown in FIG. 1. It is composed basically of a first semiconductor layer (1) of first conductivity type, a second semiconductor layer (2) of second conductivity type, and a third semiconductor layer (3). The third semiconductor layer (3) is formed between the first semiconductor layer (1) and the second semiconductor layer (2), and it has a band gap narrower than that of the first and second semiconductor layers. The third semiconductor layer (3) has a pn junction (4). The solar cell of the present invention further has a first buffer layer (5) and a second buffer layer (6).

The solar cell of the present invention has the third semiconductor layer (3) with a narrow band gap, so that it can perform photoelectric conversion for light of long wavelength and provide a large short-circuit current $I_{sc}$. However, it has a low open-circuit voltage $V_{oc}$. This means that it is impossible to increase the conversion efficiency simply by employing a semiconductor layer with a narrow band gap. On the other hand, the first semiconductor layer (1) and the second semiconductor layer (2) have a band gap wider than that of the third semiconductor layer (3), and hence it is possible to reduce the junction leakage current $I_o$. This means that it is possible to increase the open-circuit voltage $V_{oc}$ because it is related to the junction leakage current $I_o$ by the following equation.

$$V_{oc} = (kT/q) \ln (I_{sc}/I_o)$$

The consequence is an overall improvement in conversion efficiency of the solar cell.

In order for the junction leakage current $I_o$ to be reduced, it is necessary that (a) the thickness of the third semiconductor layer (3) is smaller than the diffusion length of minority carriers in the third semiconductor layer, and (b) the recombination of minority carriers takes place less frequently at the interface of the heterojunction between the third semiconductor layer (3) and the first and second semiconductor layers (1 and 2).

The recombination of minority carriers takes place less frequently at the heterojunction interface between GaAs and AlGaAs, because this combination gives rise to only a small lattice mismatch at the interface. By contrast, there is a large lattice mismatch at the interface of ordinary heterojunctions. For example, the lattice mismatch at the Si—Ge heterojunction interface is as high as 4%.

According to the present invention, the first buffer layer (5) is formed between the third semiconductor layer (3) and the first semiconductor layer (1) and the second buffer layer (6) is formed between the third semiconductor layer (3) and the second semiconductor layer (2). If these buffer layers (5 and 6) are formed such that their composition changes stepwise or continuously, then it would be possible to relieve the lattice mismatch between the third semiconductor layer (3) and the first and second semiconductor layers (1 and 2). This may be accomplished by forming the buffer layers in the following manner. That part of the first (or second) buffer layer which is adjacent to the first (or second) semiconductor layer has almost the same composition as that of the first (or second) semiconductor layer. That part of the first (or second) buffer layer which is adjacent to the third semiconductor layer has almost the same composition as that of the third semiconductor layer. In addition, the composition of the first (or second) buffer layer changes stepwise or continuously across the thickness from the interface with the first (or second) semiconductor layer toward the interface with the third semiconductor layer. The presence of such buffer layers minimizes the chance that the recombination of minority carriers takes place at the heterojunction interface.

This is demonstrated by an example as follows. The first and second semiconductor layers (1 and 2) are made of silicon having a band gap of 1.1 eV. The third semiconductor layer (3) is made of germanium having a band gap of 0.66 eV. The composition in the first and second buffer layers (5 and 6) is changed stepwise across the thickness. If a lattice mismatch up to 0.1% is to be allowed between the adjacent regions (layers) of different composition in the first and second buffer layers (5 and 6), then the number of such regions (layers) would be 0.04/0.001=40. Since the lattice constant of Si and Ge is approximately 0.55 nm, the thickness of the first and second buffer layers (5 and 6) should be at least 0.55×40=22 nm. The practical thickness should be greater than ten times that so as to reduce the lattice mismatch as much as possible. If the third semiconductor layer (3) is made of $Si_{0.5}Ge_{0.5}$, for example, it would be possible to make the first and second buffer layers (5 and 6) thinner.

As mentioned above, the solar cell of the present invention has a large $I_{sc}$ owing to the third semiconductor layer having a narrow band gap and a large $V_{oc}$ owing to the first and second semiconductor layers having a wide band gap. Moreover, it permits the recombination of minority carriers to take place less frequently at the heterojunction interface owing to the first and second buffer layers which relieve the lattice mismatch between the third semiconductor layer and the first and second semiconductor layers. These features lead to a high conversion efficiency.

If the third semiconductor layer is made from Ge, it is possible to reduce its thickness to about 1 μm as in the case of amorphous silicon layers, because the light absorption coefficient of Ge is greater than that of Si, GaAS, and amorphous Si. This leads to a material saving and hence to a cost reduction. Incidentally, the third semiconductor layer of Ge should be adequately thin so that it maintains a proper level of carrier density in the unit volume of the layer.

EXAMPLES

The invention will be described in more detail with reference to the following examples.

EXAMPLE 1

Figure 2:
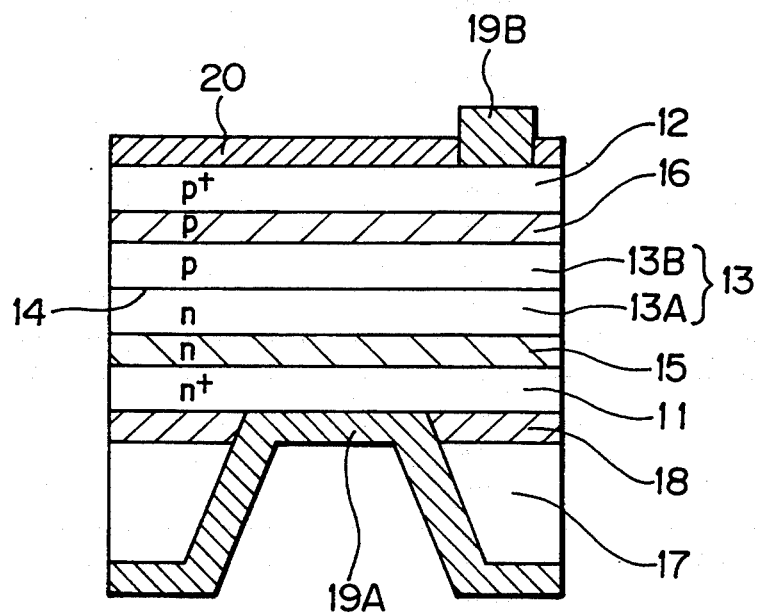
FIG. 2 is a schematic partial sectional view showing the specific structure of a solar cell according to the first embodiment of the present invention.

This example illustrates a first embodiment a solar cell of the present invention. As schematically shown in section in FIG. 2, the solar cell is composed of a substrate (17), an insulation layer (18), a first semiconductor layer (11) of polycrystalline silicon of first conductivity type (e.g., n+), a first buffer layer (15) of n-$Si_{1-x}Ge_x$, a third semiconductor layer (13) of Ge, a second buffer layer (16) of p-$Si_xGe_{1-x}$, and a second semiconductor layer (12) of Si of second conductivity type (e.g., p+) which are arranged sequentially one on top of the other. The third semiconductor layer (13) is composed of an n-type layer (13A) and a p-type layer (13B), with a pn-junction (14) between them. In the first and second buffer layers (15 and 16), the value of X changes stepwise or continuously over the range from 0 to 1.

The substrate (17) and the insulation layer (18) have an opening to accommodate a first electrode (19A) for the first semiconductor layer (11). The second semiconductor layer (12) is provided with a second electrode (19B). In addition, the second semiconductor layer (12) is provided with an antireflection film (20).

The solar cell in this example is produced in the following manner. First, the substrate (17) is coated with the insulation layer (18) of $SiO_2$, which is about 0.5 μm thick. The insulation layer (18) is coated by means of a CVD process with a P-doped polycrystalline silicon layer (about 0.2 μm thick), which is subsequently coated with a cap layer of $SiO_2$. The polycrystalline silicon layer undergoes zone melting recrystallization (ZMR) to improve crystallinity and to increase grain size. This step yields the first semiconductor layer (11) of P-doped polycrystalline silicon.

The cap layer of $SiO_2$ is removed. The first semiconductor layer (11) is coated by epitaxial growth with the first buffer layer (15) of P-doped $Si_{1-x}Ge_x$, which is about 0.1-1.0 μm thick. The first buffer layer (15) is formed such that the value of X increases stepwise or continuously across its thickness over the range from 0 to 1. The epitaxial growth employs $SiH_4$ gas as the source of Si atoms and $GeH_4$ gas as the source of Ge atoms. It is possible to increase the value of X in the first buffer layer (15) stepwise or continuously across the thickness by controlling stepwise or continuously the supply of the $SiH_4$ gas and $Ge_4$ gas.

The first buffer layer (15) produced in this way has a composition such that the ratio of Ge to Si increases stepwise or continuously across the thickness in the direction from the first semiconductor layer (11) toward the third semiconductor layer (13). This reduces the lattice mismatch at the interlayer between the first buffer layer (15) and its adjacent layers.

The first buffer layer (15) is coated by epitaxial growth with the third semiconductor layer (13A) of P-doped Ge (which is 0.5 μm thick) and then with the third semiconductor layer (13B) of B-doped Ge (which is 0.5 μm thick). In this way the third semiconductor layer (13) is formed, which is composed of the P-doped n-type layer (13A) and the B-doped p-type layer (13B), with the pn-junction (14) therebetween.

The third semiconductor layer (13) is coated by epitaxial growth with the second buffer layer (16) of B-doped $Si_xGe_{1-x}$ (which is about 0.1-1.0 μm thick). The second buffer layer (16) is formed such that the value of X therein increases stepwise or continuously across the thickness over the range from 0 to 1.

The second buffer layer (16) is coated by epitaxial growth with the second semiconductor layer (12) of B-doped Si (which is about 0.2 μm thick).

The second semiconductor layer (12) is coated with the antireflection film (20) of silicon nitride and then provided with the second electrode (19B) after selective etching of the antireflection film (20).

The substrate (17) and the insulation layer (18) are partly removed by selective etching so that a part of the first semiconductor layer (11) is exposed. The first electrode (19A) is formed on the exposed part. The total thickness from the first semiconductor layer (11) to the second semiconductor layer (12) is about 1.6-3.4 μm.

If the substrate (17) is made from single crystal silicon or polycrystalline silicon (produced by casting, electromagnetic casting, or ribbon casting), it is possible to use it as the first semiconductor layer. In this case, the insulation layer (18) may be omitted and the first buffer layer (15) may be formed by epitaxial growth directly on the substrate (17).

EXAMPLE 2

Figure 3A:
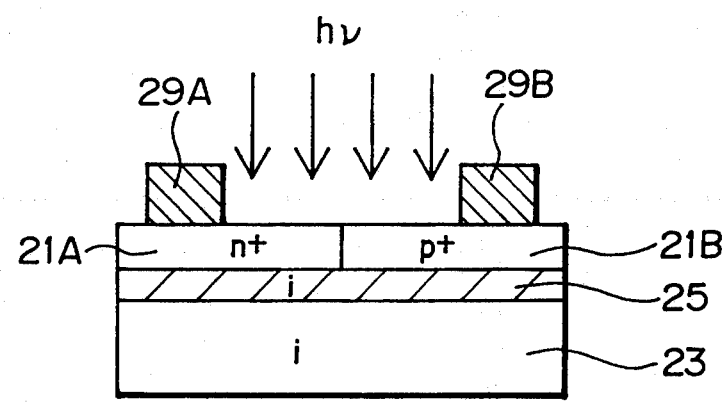
FIGS. 3(a) and 3(b) are schematic partial sectional views showing the basic and specific structures of the solar cell according to the second embodiment of the present invention.

This example illustrates a second embodiment of a solar cell of the present invention. As schematically shown in section in FIG. 3(A), the solar cell is composed of a first semiconductor layer (21), a second semiconductor layer (23), and a buffer layer (25). The first semiconductor layer (21) is composed of a first semiconductor region (21A) of the first conductivity type, which has a first electrode (29A), and a second semiconductor layer (21B) of the second conductivity type (opposite to the first conductivity type), which has a second electrode (29B). The second semiconductor layer (23) is under the first semiconductor layer (21), and the former has a narrower band gap than the latter. The buffer layer (25) is between the first and second semiconductor layers (21 and 23), so that it relieves their lattice mismatch.

The solar cell in this example is basically the same in structure as that in Example 1. It may he regarded as being composed of the first electrode (29A), the first semiconductor region (21A), the buffer layer (25), the second semiconductor layer (23), the buffer layer (25), the second semiconductor region (21B), and the second electrode (29B), which are arranged sequentially.

Figure 3B:
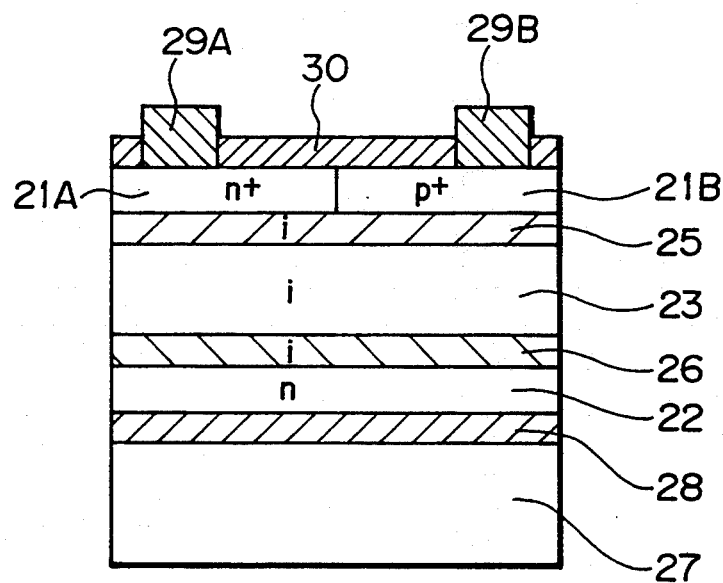

The solar cell in this example is constructed as schematically shown in section in FIG. 3(B). It is composed of a substrate (27), an insulation layer (28), a third semiconductor layer (22) of polycrystalline Si having a first conductivity type (e.g., n-type), a second buffer layer (26) of $i$-$Si_{1-x}Ge_x$, a second semiconductor layer (23) of i-Ge, a first buffer layer (25) of $i$-$Si_xGe_{1-x}$, and a first semiconductor layer (21) of Si, which are arranged sequentially one on top of the other. The first and second buffer layers (25 and 26) are formed such that the value of X changes stepwise or continuously over the range from 0 to 1.

The first semiconductor layer (21) is composed of the first semiconductor region (21A) of first conductivity type (e.g., n+) and the second semiconductor region (21B) of second conductivity type (e.g., p+) which is opposite to the first conductivity type. The first and second semiconductor regions (21A and 21B) are provided with the first and second electrodes (29A and 29B), respectively. The first and second semiconductor regions (21A and 21B) may or may not be adjacent to each other. The first semiconductor layer (21) is covered with an antireflection film (30).

The first buffer layer (25) is formed to relieve the lattice mismatch between the first and second semiconductor layers (21 and 23). It also reduces the chance that recombination of minority carriers takes place at the heterojunction interface between the first and second semiconductor layers (21 and 23).

It is desirable that the second buffer layer (26) be formed to relieve the lattice mismatch between the second and third semiconductor layers (23 and 22) and to prevent defects from occurring in the second semiconductor layer (23). It is also desirable that the third semiconductor layer (22) be formed between the second buffer layer (26) and the insulation layer (28) so as to prevent the recombination of minority carriers at their interface.

The solar cell in this example is produced in the following manner. First, the substrate (27) is coated with the insulation layer (28) of $SiO_2$, which is about 0.5 μm thick. The insulation layer (28) is coated by means of a CVD process with a P-doped polycrystalline silicon layer (about 0.2 μm thick), which is subsequently coated with a cap layer of $SiO_2$. The polycrystalline silicon layer undergoes zone melting recrystallization (ZMR) to improve crystallinity and to increase grain size. This step yields the third semiconductor layer (22) of P-doped polycrystalline silicon.

The cap layer of $SiO_2$ is then removed. The third semiconductor layer (22) is coated by epitaxial growth with the second buffer layer (26) of P-doped (or undoped) $Si_{1-x}Ge_x$, which is about 0.1-1.0 μm thick. The second buffer layer (26) is formed such that the value of X increases stepwise or continuously across the thickness over the range from 0 to 1.

The second buffer layer (26) is coated by epitaxial growth with the second semiconductor layer (23) of undoped Ge, which is 1 μm thick. The second semiconductor layer (23) is coated by epitaxial growth with the first buffer layer (25) of undoped $Si_xGe_{1-x}$, which is about 0.1-1.0 μm thick. The first buffer layer (25) is formed such that the value of X increases stepwise or continuously across the thickness over the range from 0 to 1.

The first buffer layer (25) is coated by epitaxial growth with the first semiconductor layer (21) of Si, which is about 0.2 μm thick. The first semiconductor layer (21) is doped with phosphorus and boron to form the first and second semiconductor regions (21A and 21B), respectively.

The first semiconductor layer (21) is coated with an antireflection film (30) of aluminum oxide or the like. The antireflection film (30) is partly removed by selective etching, and the first and second semiconductor regions (21A and 21B) are provided with the first and second electrodes (29A and 29B), respectively.

EXAMPLE 3

Figure 4:
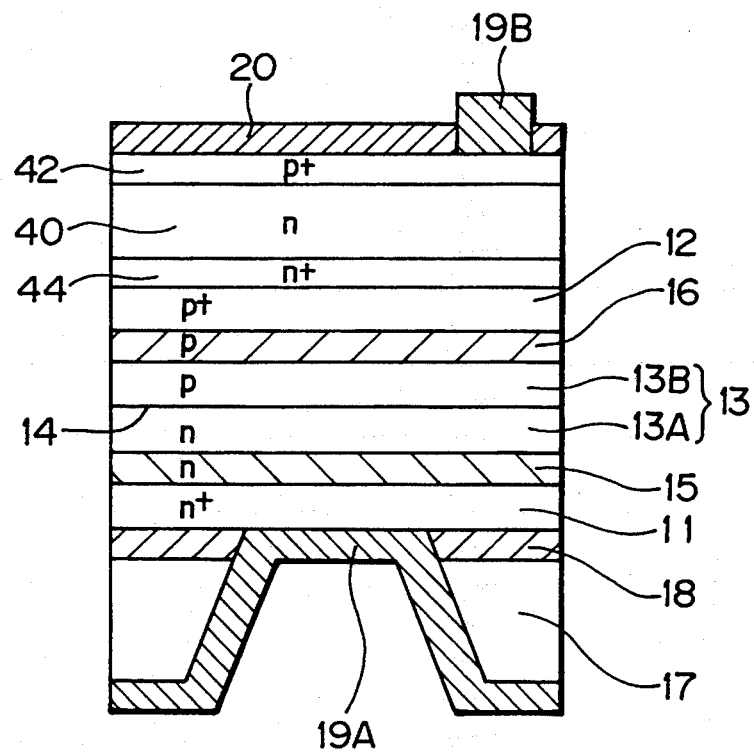
FIG. 4 is a schematic partial sectional view showing the specific structure of the solar cell according to the third embodiment of the present invention.

This example illustrates a third embodiment of a solar cell of the present invention. As schematically shown in section in FIG. 4, the solar cell is of tandem type composed of two units, the first being the same one as in Example 1 and the second having a pn structure of single crystal silicon or polycrystalline silicon. The first unit is produced in the same manner as in Example 1, and the second unit is formed on the second semiconductor layer of the first unit by the conventional procedure employed to form a pn structure.

The first unit of the solar cell is composed of a substrate (17), an insulation layer (18), a first semiconductor layer (11) of polycrystalline silicon of first conductivity type (e.g., n+), a first buffer layer (15) of $n-Si_{1-x}Ge_x$, a third semiconductor layer (13) of Ge, a second buffer layer (16) of $p-Si_xGe_{1-x}$, and a second semiconductor layer (12) of Si of second conductivity type (e.g., p+), which are arranged sequentially one on top of the other. The third semiconductor layer (13) is composed of an n-type layer (13A) and a p-type layer (13B), with a pn-junction (14) between them. In the first and second buffer layers (15 and 16), the value of X changes stepwise or continuously over the range from 0 to 1. The substrate (17) and the insulation layer (18) have an opening to accommodate the first electrode (19A) for the first semiconductor layer (11).

The second unit of the solar cell, which is formed on the second semiconductor layer (12), is composed of a fourth semiconductor layer (40) of the first conductivity type (e.g., n-type) and a fifth semiconductor layer (42) of the second conductivity type (e.g., p+-type). The second unit should preferably be about 100-150 μm thick for adequate conversion efficiency. The fifth semiconductor layer (42) is covered with an antireflection film (20) and provided with a second electrode (19B). It is desirable that a back surface field (BSF) layer (44) be formed between the second and fourth semiconductor layers (12 and 40) so as to prevent the recombination of minority carriers.

Although the invention has been described in its preferred form, it is to be understood that the invention is not limited to the specific embodiments thereof and various changes and modifications may be made therein. For example, the first conductivity type may be changed to p-type (or p+-type) and the second conductivity type may be changed to n-type (or n+-type).

The third semiconductor layer (13) in the first and third embodiments, or the second semiconductor layer (23) in the second embodiment, may be made from $Si_{1-y}Ge_y$ (where y is 0.5, 0.7, or 0.8). In this case, it is necessary that the value of Y be approximately equal to the value of X in the first and second buffer layers (15 and 16) or the first and second buffer layers (25 and 26). The sample in the third embodiment may be composed of the fourth semiconductor layer (as the substrate of Si), the BSF layer (44), the second semiconductor layer (12), the second buffer layer (16), the third semiconductor layer (13), the first buffer layer (15), and the first semiconductor layer (11), which are arranged one on top of the other.

In the first and third embodiments, the first and second semiconductor layers (11 and 12) may or may not be of the same composition and material. What is important is that the band gap of the third semiconductor layer (13) is narrower than that of the first and second semiconductor layers (11 and 12). The pn junction (14) in the third semiconductor layer (13) may be formed at any position. The third semiconductor layer (13) and the first and second buffer layers (15 and 16) may be of i-type.

In the second embodiment, the second semiconductor layer (23) may be of the second conductivity type, if necessary.

What is claimed is:
1. A solar cell which comprises
   (a) a first semiconductor layer of first conductivity type and having a first electrode, thereon,
   (b) a second semiconductor layer of second conductivity type opposite to the first conductivity type which is on said first semiconductor layer, and has a second electrode thereon,
   (c) a third semiconductor layer having a pn junction therein and positioned between said first and second semiconductor layers, and which has a band gap narrower than that of said first and second semiconductor layers,
   (d) a first buffer layer between said first and third semiconductor layers, which relieves the lattice mismatch between said first and third semiconductor layers, and
   (e) a second buffer layer between said second and third semiconductor layers, which relieves the lattice mismatch between said second and third semiconductor layers.

2. The solar cell according to claim 1, wherein said first and second semiconductor layers are composed of silicon;
   said third semiconductor layer is composed of Ge;
   said first buffer layer is composed of $N-Si_{1-x}Ge_x$;
   said second buffer layer is composed of $P-Si_xGe_{1-x}$.

3. The solar cell according to claim 1, wherein said first and second buffer layers are compositionally graded throughout a thickness thereof.

4. A solar cell which comprises
   (a) a first semiconductor layer comprising a first semiconductor region of first conductivity type and having a first electrode thereon and a second semiconductor region of second conductivity type opposite to the first conductivity type and having a second electrode thereon, (b) a second semiconductor layer beneath said first semiconductor layer, which has a band gap narrower than that of said first semiconductor layer, and (c) a buffer layer between said first and second semiconductor layers, which relieves the lattice mismatch between said first and second semiconductor layers.

5. The solar cell according to claim 4, wherein said first semiconductor layer is composed of Si and said second semiconductor layer is composed of i-Ge; and said buffer layer is composed of i-Si$_x$Ge$_{1-x}$.

6. The solar cell according to claim 5, further comprising a second buffer layer composed of i-Si$_{1-x}$Ge$_x$ arranged beneath said second semiconductor layer, and a third semiconductor layer composed polycrystalline Si arranged beneath said second buffer layer, and an insulation layer arranged beneath said third semiconductor layer, and a substrate arranged beneath said insulation layer.

7. The solar cell according to claim 4, wherein said buffer layer is compositionally graded throughout a thickness thereof.

8. A solar cell of tandem type having a bottom first solar cell and a top second solar cell being exposed to light incidence, in which the bottom first solar cell unit comprises:

(a) a first semiconductor layer of first conductivity type and having a first electrode thereon, (b) a second semiconductor layer of the second conductivity type opposite to the first conductivity type which is on said first semiconductor layer, (c) a third semiconductor layer having a pn junction therein and positioned between said first and second semiconductor layers, which has a band gap narrower than that of said first and second semiconductor layers, (d) a first buffer layer between said first and third semiconductor layers, which relieves the lattice mismatch between said first and third semiconductor layers, and (e) a second buffer layer between said second and third semiconductor layers, which relieves the lattice mismatch between said second and third semiconductor layers;

and the top second solar cell unit comprises:

(f) a fourth semiconductor layer of the first conductivity type, which is arranged on said second semiconductor layer, and (g) a fifth semiconductor layer of the second conductivity type, which is arranged on said fourth semiconductor layer.

9. The solar cell according to claim 8, further comprising a back surface field layer arranged between said second and said fourth semiconductor layers.

10. The solar cell according to claim 8, wherein:
said first semiconductor layer is composed of polycrystalline silicon of n$^+$-type conductivity;
said second semiconductor layer is composed of Si of p$^+$-type conductivity;
said third semiconductor layer is composed of Ge;
said first buffer layer is composed of n-Si$_x$Ge$_{1-x}$; and
said second buffer layer is composed of p-Si$_x$Ge$_{1-x}$.

11. The solar cell according to claim 8, wherein said first and second buffer layers are compositionally graded throughout a thickness thereof.

* * * * *